United States Patent
Kuo et al.

(10) Patent No.: US 9,379,696 B2
(45) Date of Patent: Jun. 28, 2016

(54) HIGH VOLTAGE BOOTSTRAP GATE DRIVING APPARATUS

(71) Applicant: Maxchip Electronics Corp., Hsinchu (TW)

(72) Inventors: Ming-Chi Kuo, Hsinchu (TW); Tsung-Chih Tsai, Hsinchu County (TW); Jen-Yao Hsu, Hsinchu County (TW)

(73) Assignee: Maxchip Electronics Corp., Hsinchu (TW)

( * ) Notice: Subject to any disclaimer, the term of this patent is extended or adjusted under 35 U.S.C. 154(b) by 25 days.

(21) Appl. No.: 14/294,176

(22) Filed: Jun. 3, 2014

(65) Prior Publication Data
US 2015/0311891 A1 Oct. 29, 2015

(30) Foreign Application Priority Data
Apr. 29, 2014 (TW) .............................. 103115347 A

(51) Int. Cl.
*H03K 17/16* (2006.01)
*H03K 17/14* (2006.01)
*H03K 17/687* (2006.01)
*H03K 17/06* (2006.01)

(52) U.S. Cl.
CPC ............ *H03K 17/145* (2013.01); *H03K 17/063* (2013.01); *H03K 17/162* (2013.01); *H03K 17/6871* (2013.01); *H03K 2017/6875* (2013.01); *H03K 2217/0054* (2013.01); *H03K 2217/0081* (2013.01)

(58) Field of Classification Search
USPC .................. 327/108–112, 389–391, 588–589
See application file for complete search history.

(56) References Cited

U.S. PATENT DOCUMENTS

| | | | |
|---|---|---|---|
| 5,883,547 A | 3/1999 | Diazzi et al. | |
| 6,353,345 B1 | 3/2002 | Yushan et al. | |
| 6,507,085 B2 | 1/2003 | Shimizu | |
| 7,106,105 B2 | 9/2006 | Bryson | |
| 7,710,167 B2 * | 5/2010 | Bernacchia | 327/108 |
| 8,710,875 B2 * | 4/2014 | Bai et al. | 327/109 |
| 2006/0017466 A1 | 1/2006 | Bryson | |
| 2008/0100378 A1 | 5/2008 | Bernacchia | |

FOREIGN PATENT DOCUMENTS

| | | |
|---|---|---|
| CN | 1914787 | 12/2011 |
| TW | 201249080 | 12/2012 |
| TW | I400865 | 7/2013 |

OTHER PUBLICATIONS

"Office Action of Taiwan Counterpart Application", issued on Jun. 18, 2015, p. 1-p. 7, in which the listed references were cited.

* cited by examiner

*Primary Examiner* — An Luu
(74) *Attorney, Agent, or Firm* — Jianq Chyun IP Office

(57) ABSTRACT

A high voltage bootstrap gate driving apparatus is provided. The gate driving apparatus includes a high-end transistor, a low-end transistor, a buffer, a boost capacitor, and a high voltage depletion transistor. The high-end transistor receives a first power voltage. The buffer provides a high-end driving signal to the high-end transistor according to a bias voltage. The boost capacitor is serial coupled between a base voltage and a bias voltage. A first end of the depletion transistor is coupled to a second power voltage, a second end of the depletion transistor is coupled to the bias voltage, and a control end of the depletion transistor receives the reference ground voltage.

10 Claims, 3 Drawing Sheets

HIGH VOLTAGE BOOTSTRAP GATE DRIVING APPARATUS

CROSS-REFERENCE TO RELATED APPLICATION

This application claims the priority benefit of Taiwan application serial no. 103115347, filed on Apr. 29, 2014. The entirety of the above-mentioned patent application is hereby incorporated by reference herein and made a part of this specification.

BACKGROUND OF THE INVENTION

1. Field of the Invention

The invention relates to a gate driving apparatus, and more particularly, to a bootstrap gate driving apparatus.

2. Description of Related Art

Please refer to FIG. 1. FIG. 1 illustrates a circuit diagram of a conventional gate driving apparatus 100. The gate driving apparatus 100 includes an integrated circuit 110, a bootstrap diode DB, a boost capacitor CB, and transistors Q1, Q2. The gate driving apparatus 100 provides electrical signals through alternative switching actions of the transistors Q1, Q2 to drive the inductor L which serves as a load.

The transistors Q1 and Q2 are serial coupled between a power voltage VDC and a reference ground voltage GND sequentially, and the transistors Q1 and Q2 respectively receive a high-end driving signal HO and a low-end driving signal LO of the integrated circuit 110 to become conductive or disconnected. The boost capacitor CB is serial coupled between the base voltage VS and the bias voltage VB provided by the integrated circuit 110. As the gate driving apparatus 100 is undergoing an operation, the transistor Q2 first becomes conductive such that the integrated circuit 110 provides a power voltage VDD to charge the boost capacitor CB to the power voltage VDD through the bootstrap diode DB. Moreover, as the transistor Q1 is conductive and after the transistor Q2 is disconnected, the bias voltage VB may be pulled up to VDC+VDD by the boost capacitor CB, and the high-end driving signal HO produced according to the bias voltage VB is also pulled up to VDC+VDD accordingly.

Herein, the bootstrap diode DB must have an ability to withstand high reverse bias voltage, so that as the bias voltage VB is charged to high, no refluxed current back to the power voltage VDD is produced. Therefore, an additional plug-in bootstrap diode DB outside the integrated circuit 110 is often used to construct in conventional techniques, and such approach may result in increased cost of the circuit.

In addition, in the conventional techniques, a switching transistor and a control circuit may also be disposed in the integrated circuit 110. Through the control circuit, the conduction or the disconnection of the switching transistor is controlled, such that the boost capacitor CB may perform the pull-up actions, and possibilities that the refluxed current refluxes back to the power voltage VDD are prevented. However, such approach requires extra control circuit to complete, which requires a higher cost of the circuit.

SUMMARY OF THE INVENTION

The invention provides a high voltage bootstrap gate driving apparatus, wherein at low cost considerations, a leakage current produced due to the disposition of the transistor in an integrated circuit and the cost of the circuit may be effectively reduced.

The high voltage bootstrap gate driving apparatus of the invention includes a high-end transistor, a low-end transistor, a buffer, a boost capacitor, and a depletion transistor. The high-end transistor has a first end, a second end, and a control end, wherein the first end of the high-end transistor receives a first power voltage. The low-end transistor has a first end, a second end, and a control end, wherein the first end of the low-end transistor is coupled to the second end of the high-end transistor, and the second end of the low-end transistor is coupled to a reference ground voltage. The buffer provides a high-end driving signal to the control end of the high-end transistor according to a bias voltage, and provides a low-end driving signal to the control end of the low-end transistor. The boost capacitor is serial coupled between a base voltage and the bias voltage. The depletion transistor has a first end, a second end, and a control end. The first end of the depletion transistor is coupled to a second power voltage. The second end of the depletion transistor is coupled to the bias voltage. The control end of the depletion transistor receives the reference ground voltage.

In an embodiment of the invention, the above-mentioned depletion transistor may be an N-type depletion transistor and an N-type junction field effect transistor.

In an embodiment of the invention, a base of the above-mentioned depletion transistor is coupled to the reference ground voltage.

In an embodiment of the invention, both the above-mentioned high-end transistor and the low-end transistor are N-type transistors.

In an embodiment of the invention, as the above-mentioned low-end transistor is conductive according to the low-end driving signal, the high-end transistor is disconnected, and the second power voltage charges the boost capacitor through the depletion transistor, so that the bias voltage is equal to a threshold turn-off voltage of the depletion transistor, by which the second power voltage may also be self-regulated to prevent itself from being too high such that the high-end transistor is burned due to the bias voltage being charged excessively. As the high-end transistor is conductive according to the high-end driving signal, the low-end transistor is disconnected, and the bias voltage is pulled up to be equal to the first power voltage plus the threshold turn-off voltage.

In an embodiment of the invention, the above-mentioned buffer includes a high-end buffer and a low-end buffer. The high-end buffer is coupled to the second end of the depletion transistor, the control end of the high-end transistor, and the second end of the high-end transistor. The high-end buffer adjusts a voltage level of the high-end driving signal according to the bias voltage. The low-end buffer is coupled to the control end of the low-end transistor, and the low-end buffer provides the low-end driving signal.

In an embodiment of the invention, the gate driving apparatus further includes a core circuit. The core circuit is coupled to the high-end buffer and the low-end buffer. The core circuit provides a high-end control signal and a low-end control signal to the high-end buffer and the low-end buffer respectively. The high-end buffer and the low-end buffer produce the high-end driving signal and the low-end driving signal respectively according to the high-end control signal and the low-end control signal respectively.

In an embodiment of the invention, both the above-mentioned high-end driving signal and the low-end driving signal are pulse width modulation signal.

In an embodiment of the invention, a voltage level of the above-mentioned first power voltage is greater than a voltage level of the above-mentioned second power voltage.

In an embodiment of the invention, a reverse breakdown voltage of the above-mentioned depletion transistor is greater than a voltage level of the first power voltage plus a voltage level of a threshold turn-off voltage of the depletion transistor.

According to the above, as the high-end transistor is disconnected in the invention, a constantly-conductive path is provided between the second power voltage and the bias voltage through the depletion transistor, so that as the high-end transistor is conductive, the bias voltage may be pulled up to higher than the voltage level of the first power voltage. Accordingly, the voltage level of the high-end driving signal received by the high-end transistor may be higher than the first power voltage, and the working efficiency of the high-end transistor may be enhanced.

In order to make the aforementioned and other features and advantages of the invention comprehensible, embodiments accompanied with figures are described in detail below.

DESCRIPTION OF EMBODIMENTS

Figure 1:
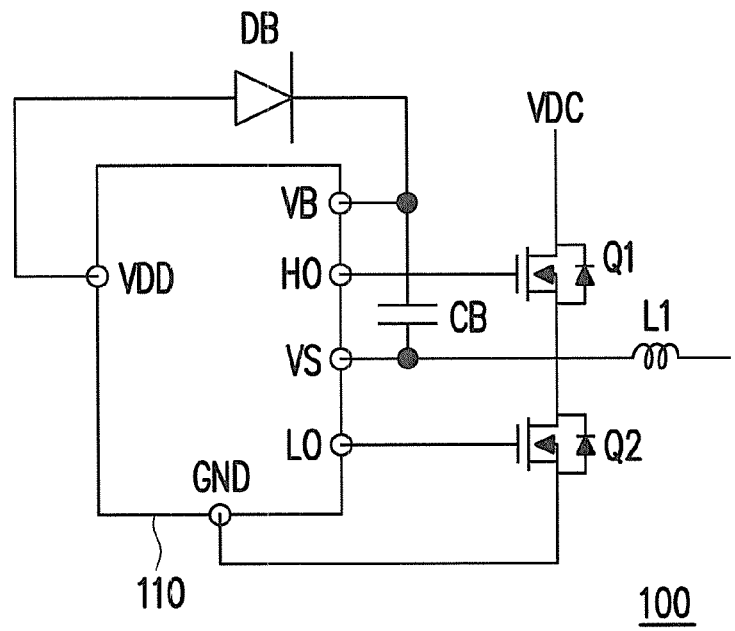
FIG. 1 illustrates a circuit diagram of a conventional gate driving apparatus 100.
Figure 2:
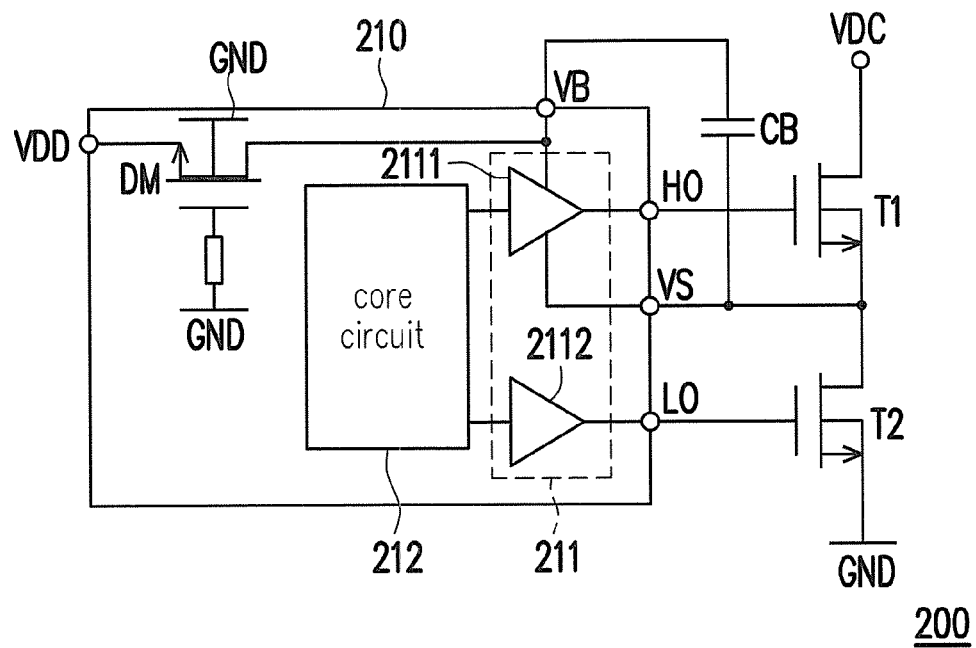
FIG. 2 illustrates a schematic diagram of a gate driving apparatus 200 according to an embodiment of the invention.

Please refer to FIG. 2. FIG. 2 illustrates a schematic diagram of a gate driving apparatus 200 according to an embodiment of the invention. The gate driving apparatus 200 includes a high-end transistor T1, a low-end transistor T2, a buffer 211, a core circuit 212, a boost capacitor CB, and a depletion transistor DM. In the present embodiment, the buffer 211, the core circuit 212, and the depletion transistor DM may be disposed in an integrated circuit 210. The high-end transistor T1 and the low-end transistor T2 may be N-TYPE transistors.

The high-end transistor T1 has a first end, a second end, and a control end. The first end of the high-end transistor T1 receives a power voltage VDC. The control end of the high-end transistor T1 is coupled to the buffer 211 to receive a high-end driving signal HO. The second end of the high-end transistor T1 is coupled to the first end of the low-end transistor T2. The second end of the low-end transistor T2 is coupled to a reference ground voltage GND. The control end of the low-end transistor T2 is coupled to the buffer 211 to receive a low-end driving signal LO.

The boost capacitor CB is coupled to a base voltage VS, in addition, another end of the boost capacitor CB is coupled to the buffer 211. Moreover, the boost capacitor CB is coupled to the end of the buffer 211 to provide a bias voltage VB.

The depletion transistor DM has a first end, a second end, and a control end. The first end of the depletion transistor DM is coupled to a second power voltage VDD. The second end of the depletion transistor DM is coupled to the bias voltage VB. Moreover, both the control end and a base end of the depletion transistor DM are coupled to the reference ground voltage GND.

As to an overall operation, as the gate driving apparatus 200 is undergone the operation, the transistor T2 is conductive according to the low-end driving signal LO, and the transistor T1 is disconnected according to the high-end driving signal HO. At the time, a voltage level of the base voltage VS is equal to a voltage level of the reference ground voltage GND (e.g. equal to 0 volt). Moreover, under the condition that the depletion transistor DM is the N-type depletion transistor, the depletion transistor DM is under the conductive state and transmits the power voltage VDD to charge the boost capacitor CB, so that the voltage level of the bias voltage VB is equal to a threshold turn-off voltage VTH of the depletion transistor DM. Next, the transistor T1 is conductive according to the high-end driving signal HO, and the transistor T2 is disconnected according to the low-end driving signal LO. Additionally, at the time, the voltage level of the base voltage VS is pulled up to be equal to the voltage level of the power voltage VDC, and the voltage level of the bias voltage VB is pulled up to be equal to the voltage level of the power voltage VDC plus the voltage level of the threshold turn-off voltage VTH of the depletion transistor DM through the boost capacitor CB.

Incidentally, the depletion transistor DM may also be an N-type junction field effect transistor.

On the other hand, the buffer 211 includes a high-end buffer 2111 and a low-end buffer 2112 to produce the high-end driving signal HO and the low-end driving signal LO respectively. The high-end buffer 2111 receives the bias voltage VB and the base voltage VS to be an operating power and a reference ground power respectively. Under the condition that the voltage level of the bias voltage VB is pulled up to be equal to VDC+VTH, the high-end driving signal HO of which the voltage level is equal to VDC+VTH may be produced by the high-end buffer 2111, thereby further lowering an equivalent impedance of the high-end transistor T1 and enhancing a driving efficiency of high-end transistor T1.

It should be noted that, the reverse breakdown voltage of the depletion transistor DM is greater than VDC+VTH. Therefore, as the voltage level of the bias voltage VB is equal to VDC+VTH, the depletion transistor DM may prevent the current from refluxing back to the power voltage VDD through the conductive high-end transistor T1. In the present embodiment, the voltage level of the power voltage VDC is greater than the voltage level of the power voltage VDD. For example, the voltage level of the power voltage VDC may be 600V, and the voltage level of the power voltage VDD may be 15V.

Incidentally, the core circuit 212 is coupled to input ends of the high-end buffer 2111 and the low-end buffer 2112, and transmits the high-end control signal and the low-end control signal to the input ends of the high-end buffer 2111 and the low-end buffer 2112 respectively. Herein, the high-end buffer 2111 and the low-end buffer 2112 produce the high-end driving signal HO and the low-end driving signal LO respectively according to the high-end control signal and the low-end control signal respectively, wherein both the high-end driving signal HO and the low-end driving signal LO are pulse width modulation signals.

It can be known from the above description that, in the gate driving apparatus 200 according to the embodiment of the invention, actions of pulling up the bias voltage VB may be completed successfully through disposing the depletion transistor DM between the power voltage VDD and the bias voltage VB. Under this condition, the depletion transistor DM may be an electronic component embedded in the integrated circuit 210 instead of an electronic component external from the integrated circuit 210. Moreover, there is no need to set a corresponding control circuit for the depletion transistor DM to control the conductive state or the disconnected state thereof, which effectively saves the required cost of the circuit.

Figure 3A:
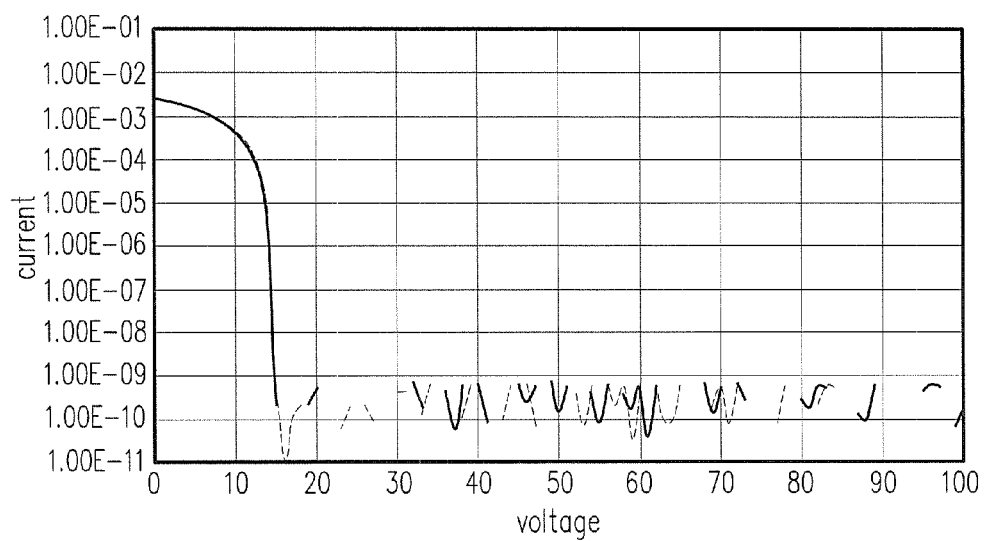
FIG. 3A and FIG. 3B illustrate current-voltage characteristic curve diagrams of charging and reverse breakdown of a depletion transistor according to embodiments of the invention respectively.
Figure 3B:
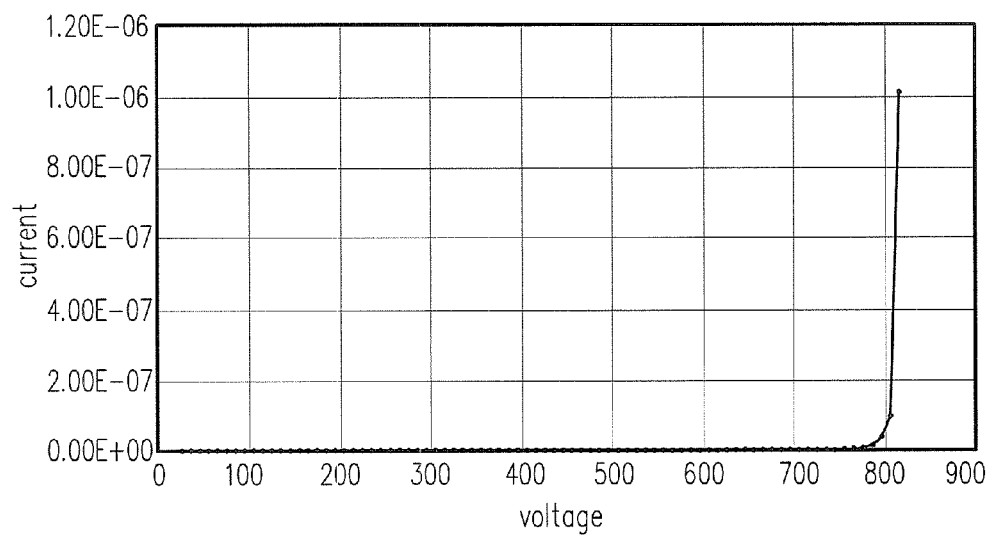

Please refer to FIG. 2, FIG. 3A, and FIG. 3B in the following. FIG. 3A and FIG. 3B illustrate current-voltage characteristic curve diagrams of charging and reverse breakdown of a depletion transistor according to embodiments of the invention respectively. In FIG. 3A, the threshold turn-off voltage VTH of the depletion transistor DM is approximately equal to 16V. Under the condition that a drain-source voltage difference of the depletion transistor DM is greater than 16V, the depletion transistor DM may be turned-off correspondingly. Furthermore, in FIG. 3B, under the condition that the drain-source voltage difference of the depletion transistor DM is less than about 800V, the reverse breakdown phenomena can all be prevented by the depletion transistor DM. Accordingly, when applying the depletion transistor DM in FIG. 3B, under the conditions that the voltage level of the bias voltage VB is pulled up to be equal to VDC+VTH and maximum value of VDC+VTH is about 700V, the current reflux phenomenon can be effectively prevented by the depletion transistor DM.

Figure 4:
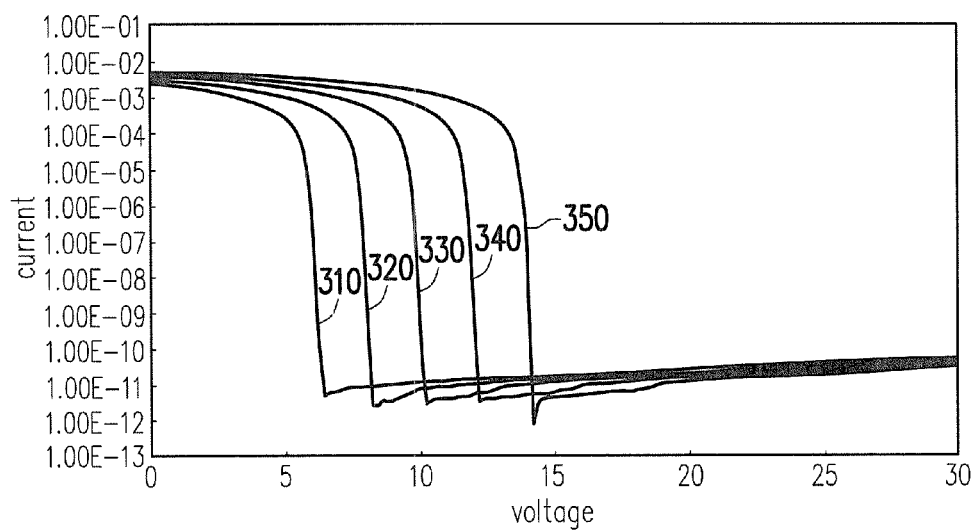
FIG. 4 illustrates a current-voltage characteristic curve diagram of a depletion transistor according to an embodiment of the invention.
Figure 5:
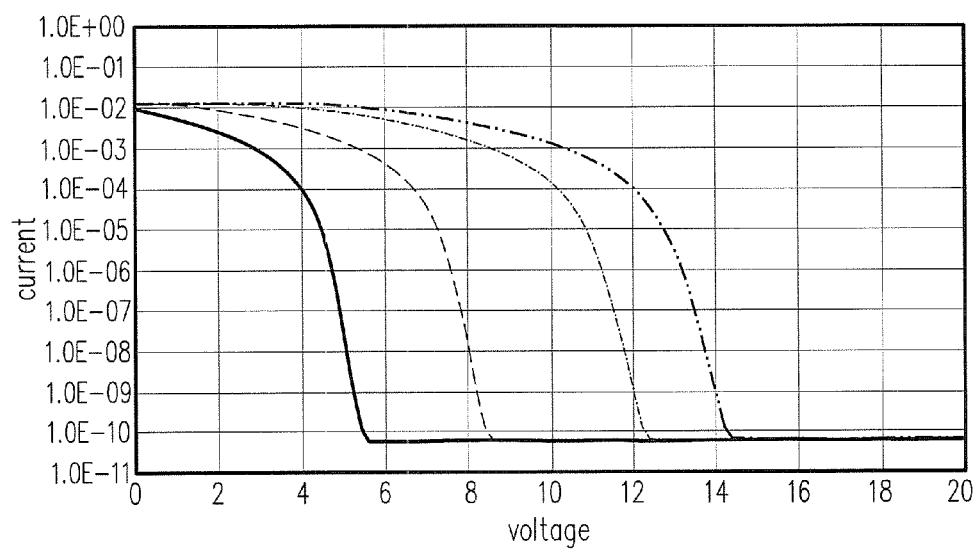
FIG. 5 illustrates a current-voltage characteristic curve diagram of a depletion transistor according to an embodiment of the invention at different threshold turn-off voltages.

Please refer to FIG. 2 and FIG. 4. FIG. 4 illustrates a current-voltage characteristic curve diagram of a depletion transistor according to an embodiment of the invention. In FIG. 4, curves 310 to 350 are different current-voltage characteristic curves in an order of the bias voltages between the source (which is coupled to the power voltage VDD) and the gate (which is coupled to the reference ground voltage GND) of the depletion transistor DM which increases from 0 V to 12 V respectively. It can be seen from the curves 310 to 350 that, through controlling the magnitude of the power voltage received by the gate, the threshold turn-off voltage of the depletion transistor DM may be controlled. That is, through controlling the magnitude of the power voltage received by the gate, the pull-up magnitude of the bias voltage VB may also be controlled. To meet the requirement, the threshold turn-off voltage of the depletion transistor DM may also be simply adjusted at the time of manufacturing. Please refer to FIG. 5. FIG. 5 illustrates a current-voltage characteristic curve diagram of a depletion transistor according to an embodiment of the invention at different threshold turn-off voltages.

According to the above, in the invention, through disposing the depletion transistor between the relatively low power voltage and the bias voltage, under the premise that the depletion transistor is preset conductive, the depletion transistor may provide the charging path of the boost capacitor. Moreover, after the pull-up action is performed to the bias voltage by the boost capacitor, the depletion transistor may block the current reflux path between the pulled-up bias voltage and the relatively low power voltage. Through the manner described above, no plug-in electronic component is required in the invention. Furthermore, there is also no need to set an additional control circuit to control the conductive state or the disconnected state of the charging path of the boost capacitor, which effectively saves the required cost of the circuit.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A high voltage bootstrap gate driving apparatus, comprising:
    a high-end transistor, having a first end, a second end, and a control end, wherein the first end of the high-end transistor receives a first power voltage;
    a low-end transistor, having a first end, a second end, and a control end, wherein the first end of the low-end transistor is coupled to the second end of the high-end transistor, and the second end of the low-end transistor is coupled to a reference ground voltage;
    a buffer, providing a high-end driving signal to the control end of the high-end transistor according to a bias voltage, and providing a low-end driving signal to the control end of the low-end transistor;
    a boost capacitor, serial coupled between a base voltage and the bias voltage, wherein the base voltage is produced at the second end of the high-end transistor;
    a depletion transistor, having a first end, a second end, and a control end, wherein the first end of the depletion transistor is coupled to a second power voltage, the second end of the depletion transistor is coupled to the bias voltage, and the control end of the depletion transistor receives the reference ground voltage,
    wherein the buffer, the high-end transistor, the low-end transistor, the boost capacitor and the depletion transistor are disposed in an integrated circuit,
    wherein as the low-end transistor is conductive according to the low-end driving signal, the high-end transistor is disconnected, and the second power voltage charges the boost capacitor through the depletion transistor, so that the bias voltage is equal to a threshold turn-off voltage of the depletion transistor, wherein when the high-end transistor is conductive according to the high-end driving signal, the low-end transistor is disconnected, and the bias voltage is pulled up to be equal to the first power voltage plus the threshold turn-off voltage.

2. The high voltage bootstrap gate driving apparatus as claimed in claim 1, wherein the depletion transistor is an N-type depletion transistor or an N-type junction field effect transistor.

3. The high voltage bootstrap gate driving apparatus as claimed in claim 2, wherein a base of the depletion transistor is coupled to the reference ground voltage.

4. The high voltage bootstrap gate driving apparatus as claimed in claim 1, wherein the high-end transistor and the low-end transistor are N-type transistors.

5. The high voltage bootstrap gate driving apparatus as claimed in claim 1, wherein the buffer comprises:
    a high-end buffer, coupled to the second end of the depletion transistor, the control end of the high-end transistor, and the second end of the high-end transistor, wherein the high-end buffer adjusts a voltage level of the high-end driving signal according to the bias voltage; and
    a low-end buffer, coupled to the control end of the low-end transistor, and providing the low-end driving signal.

6. The high voltage bootstrap gate driving apparatus as claimed in claim 5, further comprising:
    a core circuit, coupled to the high-end buffer and the low-end buffer, the core circuit provides a high-end control signal and a low-end control signal to the high-end buffer and the low-end buffer respectively,
    wherein the high-end buffer and the low-end buffer produce the high-end driving signal and the low-end driving signal respectively according to the high-end control signal and the low-end control signal respectively.

7. The high voltage bootstrap gate driving apparatus as claimed in claim 1, wherein both the high-end driving signal and the low-end driving signal are pulse width modulation signals.

8. The high voltage bootstrap gate driving apparatus as claimed in claim 1, wherein a voltage level of the first power voltage is greater than a voltage level of the second power voltage.

9. The high voltage bootstrap gate driving apparatus as claimed in claim 1, wherein a reverse breakdown voltage of the depletion transistor is greater than a voltage level of the first power voltage plus a voltage level of a threshold turn-off voltage of the depletion transistor.

10. A high voltage bootstrap gate driving apparatus, comprising:
   a high-end transistor, having a first end, a second end, and a control end, wherein the first end of the high-end transistor receives a first power voltage;
   a low-end transistor, having a first end, a second end, and a control end, wherein the first end of the low-end transistor is coupled to the second end of the high-end transistor, and the second end of the low-end transistor is coupled to a reference ground voltage;
   a buffer, providing a high-end driving signal to the control end of the high-end transistor according to a bias voltage, and providing a low-end driving signal to the control end of the low-end transistor;
   a boost capacitor, serial coupled between a base voltage and the bias voltage, wherein the base voltage is produced at the second end of the high-end transistor;
   a depletion transistor, having a first end, a second end, and a control end, wherein the first end of the depletion transistor is coupled to a second power voltage, the second end of the depletion transistor is coupled to the bias voltage, and the control end of the depletion transistor receives the reference ground voltage,
   wherein the buffer, the high-end transistor, the low-end transistor, the boost capacitor and the depletion transistor are disposed in an integrated circuit,
   wherein a reverse breakdown voltage of the depletion transistor is greater than a voltage level of the first power voltage plus a voltage level of a threshold turn-off voltage of the depletion transistor.

* * * * *